United States Patent [19]
Ma et al.

[11] Patent Number: 5,783,101
[45] Date of Patent: Jul. 21, 1998

[54] HIGH ETCH RATE RESIDUE FREE METAL ETCH PROCESS WITH LOW FREQUENCY HIGH POWER INDUCTIVE COUPLED PLASMA

[75] Inventors: Diana Xiaobing Ma, San Jose; Gerald Zheyao Yin, Cupertino; Hiroji Hanawa, Sunnyvale, all of Calif.

[73] Assignee: Applied Materials, Inc., Santa Clara, Calif.

[21] Appl. No.: 307,870

[22] Filed: Sep. 16, 1994

[51] Int. Cl.$^6$ .................................................. H01L 21/02
[52] U.S. Cl. .................. 216/68; 156/643.1; 156/646.1; 216/41; 216/67; 216/74; 216/75; 216/77; 216/78
[58] Field of Search ................... 156/643.1, 646.1, 156/345 P; 216/67, 68, 74, 75, 77, 78

[56] References Cited

U.S. PATENT DOCUMENTS

| | | | |
|---|---|---|---|
| 4,253,907 | 3/1981 | Parry et al. | 156/646.1 |
| 4,464,223 | 8/1984 | Gorin | 156/646.1 |
| 4,490,209 | 12/1984 | Hartman | 156/646.1 |
| 4,505,782 | 3/1985 | Jacob et al. | 156/646.1 |
| 4,680,086 | 7/1987 | Thomas et al. | 156/646.1 |
| 4,717,448 | 1/1988 | Cox et al. | 156/646.1 |
| 4,832,787 | 5/1989 | Bondur et al. | |
| 4,844,775 | 7/1989 | Keeble | 156/643.1 |
| 5,122,251 | 6/1992 | Campbell et al. | 156/345 |
| 5,346,578 | 9/1994 | Benzing et al. | 156/345 |

FOREIGN PATENT DOCUMENTS

A-0 596 551  5/1994  European Pat. Off. .

OTHER PUBLICATIONS

Givens, J. et al. "Selective Dry Etching in a High Density Plasma for 0.5 UM Complementary Metal–Oxide–Semiconductor." Journal of Vacuum Science and Technology: Part B, vol. 12, No. 1, Jan. 1, 1994, pp. 427–432.

*Primary Examiner*—T. Tung
*Attorney, Agent, or Firm*—Michaelson & Wallace

[57] ABSTRACT

The plasma source power frequency in a plasma etch reactor is reduced to a low RF frequency such as about 2 MHz. It is a discovery of this invention that at this low frequency, capacitive coupling from the plasma power source is reduced, and the plasma source power level may be increased beyond 750 Watts to reduce capacitive coupling and provide a high density inductively coupled plasma without appreciably increasing the ion bombardment energy. Moreover, under these conditions the etchant (e.g., chlorine) concentration in the plasma may be increased to about 80 percent without decreasing etch uniformity to provide a very high metal alloy etch rate with complete residue removal, no profile microloading, and no etch rate microloading, the process being applicable over a wide window of metal alloy compositions.

31 Claims, 3 Drawing Sheets

HIGH ETCH RATE RESIDUE FREE METAL ETCH PROCESS WITH LOW FREQUENCY HIGH POWER INDUCTIVE COUPLED PLASMA

BACKGROUND OF THE INVENTION

1. Technical Field

The invention is related to metal etch plasma processing and in particular to plasma etching of aluminum films on integrated circuits, such as integrated circuits with silicon substrates, as one of many possible examples.

2. Background Art

1. Plasma Metal Etch Processes in General

Integrated circuits typically include at least one metal layer overlying an insulating layer or thin film covering underlying semiconductor features. Conductor paths are defined in the metal by photolithographically defining and etching features therein. Typically, the metal layer is an alloy of aluminum, containing, for example, one percent of copper or silicon. Generally, a metal etch plasma process is carried out in a plasma reactor chamber. While the bulk metal (e.g., aluminum) is removed by etching, the alloy impurity (e.g., copper) is removed primarily by the sputtering action of the plasma ions.

A significant problem in plasma etching of metal is that often the etch process leaves residues generated by the etching of the metal alloy material, such residues contaminating the integrated circuit. Such metal etch residues can arise from the segregation of silicon and copper in the metal alloy into the grain boundary. This is because the physical sputtering rate of the silicon and copper-rich phase is lower than the aluminum etch rate. A fundamental limitation of metal etch plasma processes has been a seemingly unavoidable conflict between the goal of a thorough removal of metal etch residues and the goals of a high etch rate, high photoresist selectivity, thorough removal of sidewall residue deposition and minimizing etch profile microloading and etch rate microloading.

For example, one prior art solution to the residue problem was to reduce the etch rate of the bulk metal (e.g., the aluminum) so that the bulk metal and the alloy impurity were removed at similar rates. Such an etch rate reduction was achieved by reducing the etchant (e.g., chlorine) concentration in the plasma. Another solution to this problem was to increase the sputtering rate of the alloy impurity (e.g., copper or silicon) by increasing the ion bombardment energy. Such an increase in ion bombardment energy is typically achieved by increasing the R.F. power applied to the plasma.

Such prior art solutions thus require a precise balance between the metal alloy etch rate and the sputtering rate in accordance with the particular alloy impurities (e.g., copper, silicon, etc.) contained in the alloy and their concentrations. Such a precise balance is upset by any change in concentration or substitution of other alloy impurities in the bulk metal. As a result, a given metal etch plasma process is typically workable over a very narrow window or range of different alloys, alloy concentrations and operating conditions, a significant disadvantage.

Also, the foregoing prior art solutions unfortunately tend to promote an undesirable loss of photoresist, thick sidewall deposition of photoresist etch by-products and, consequently, etch profile microloading. The term etch profile microloading refers to the dependency of the etch profile (metal sidewall angle) on the feature density. This phenomenon arises from polymer residues generated by etch by-products of metal and photoresist. Such polymer residues tend to condense onto the sidewalls of features etched in the metal alloy layer during the etching process, thereby distorting the etched sidewall profile if not removed by ion bombardment during the etch process, a significant problem. FIG. 1 illustrates an integrated circuit with a metal alloy layer with photoresist deposited thereover in accordance with conventional photolithographic techniques. FIG. 2 shows the same circuit after plasma etch processing. As indicated in FIG. 2, etched vertical sidewalls are realized where the etched features in the metal layer are closely spaced. This is because the closely spaced vertical walls funnel the plasma ions as they ricochet between adjacent walls down their entire height, so that sidewall polymer residues are thoroughly removed during the etch process. Etched slanted sidewalls are realized primarily in regions in which the etched features in the metal layer are relatively far apart, as indicated in FIG. 2, so that there is little or no ricocheting of the ions between adjacent vertical walls and consequently less sputtering or removal of the sidewall polymer residue.

In the case of the first prior art solution, in which the metal alloy etch rate is reduced, etch profile microloading arises because the metal etch rate has been decreased so that the ratio of metal etch rate to polymer deposition rate is decreased. In the case of the second prior art solution, in which the ion bombardment energy is increased, etch profile microloading arises because the polymer residue deposition rate has been increased relative to the metal etch rate.

2. Commercially Available Plasma Metal Etch Processes Employing Independent Source and Bias RF Generators Commercially available inductively coupled plasma metal etch processes typically employ one RF generator connected to a coil surrounding a portion of the reactor chamber as a plasma power source, and another RF generator connected to the wafer pedestal as a bias voltage source. These processes typically operate at relatively low pressures with the plasma power source having a frequency of 13.56 mHz. One problem is that capacitive coupling from the 13.56 mHz plasma power source to the plasma is so great that, in order to avoid photoresist loss and etch profile microloading from excessive sputtering of the photoresist, the plasma source power is limited to less than 900 Watts. Such a relatively low power provides a plasma ion density which is relatively low compared to other high density plasma reactors. With such a low plasma ion density, the only way to enhance removal of impurity residues is to increase the RF bias source power or reduce the aluminum etch rate, as in RIE etching. However, a significant increase in RF bias source power leads to low photoresist etch selectivity, etch profile microloading and trenching underneath oxide films.

A related problem is that the relatively low ion density limits the rate of removal by ion bombardment of alloy impurities. In order to balance the removal rate of alloy impurities with the metal etch rate, such commercially available plasma metal etch processes normally limit the concentration of etchant (chlorine) gases in the plasma to less than about 50%.

Another problem with commercially available plasma metal etch reactors is that the plasma RF power source and the bias RF power source both operate at or near the same frequency, giving rise to RF interference and poor RF match stability.

3. Reactive Ion Etch Plasma Processes

Reactive ion etch (RIE) plasma processes employ a pair of opposing electrodes connected across a single RF power source. In addition to the problems discussed above, another problem with RIE metal etch plasma processes is that increasing ion density to increase residue removal capability by increasing the plasma source power proportionately increases the ion bombardment energy and hence increases the undesirable sidewall deposition of photoresist polymer residues.

SUMMARY OF THE DISCLOSURE

All of the foregoing problems, limitations and tradeoffs are overcome in a high density plasma metal alloy etch process of the present invention. In accordance with the present invention, the plasma source power frequency is reduced to a low RF frequency such as about 2 MHz. It is a discovery of this invention that at such a low frequency, capacitive coupling from the plasma power source is reduced, and the plasma source power level may thus be increased beyond 750 Watts with minimal capacitive coupling, providing a high density inductively coupled plasma without appreciably increasing the ion bombardment energy. Moreover, under these conditions the etchant (e.g., chlorine) concentration in the plasma may be increased to about 80 percent without increasing impurity residue formation. This provides a very high metal alloy etch rate with thorough residue removal and minimal profile microloading, the process being applicable over a wide window of metal alloy compositions.

DETAILED DESCRIPTION OF THE PREFERRED EMBODIMENT

Figures 1, 2:
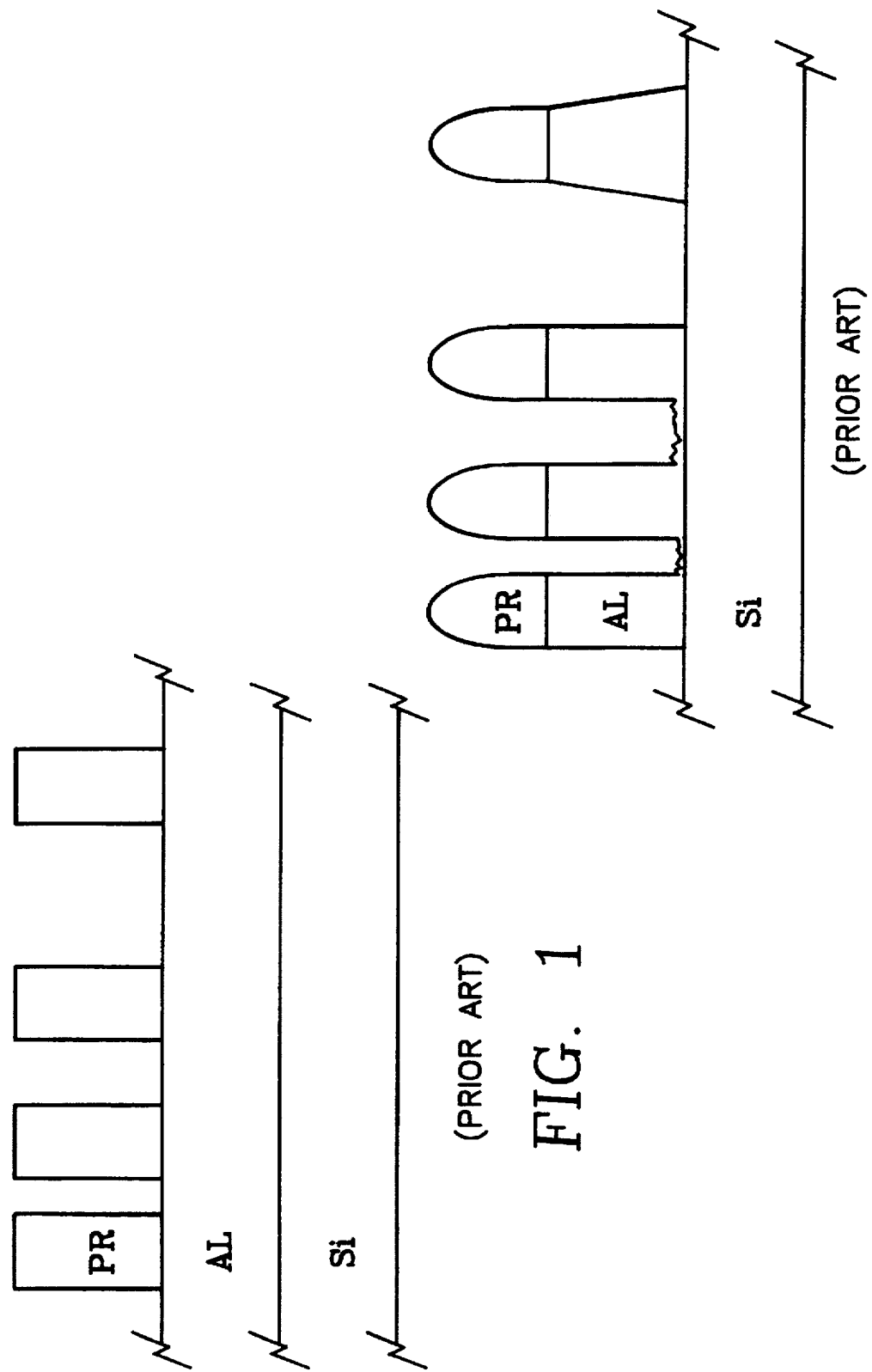
FIG. 1 is a partial cross-sectional view of a semiconductor integrated circuit during fabrication prior to etching a metal alloy layer.
FIG. 2 is a partial cross-sectional view corresponding to FIG. 1 after etching of the metal alloy layer, illustrating etch profile microloading and etch rate microloading.
Figure 3:
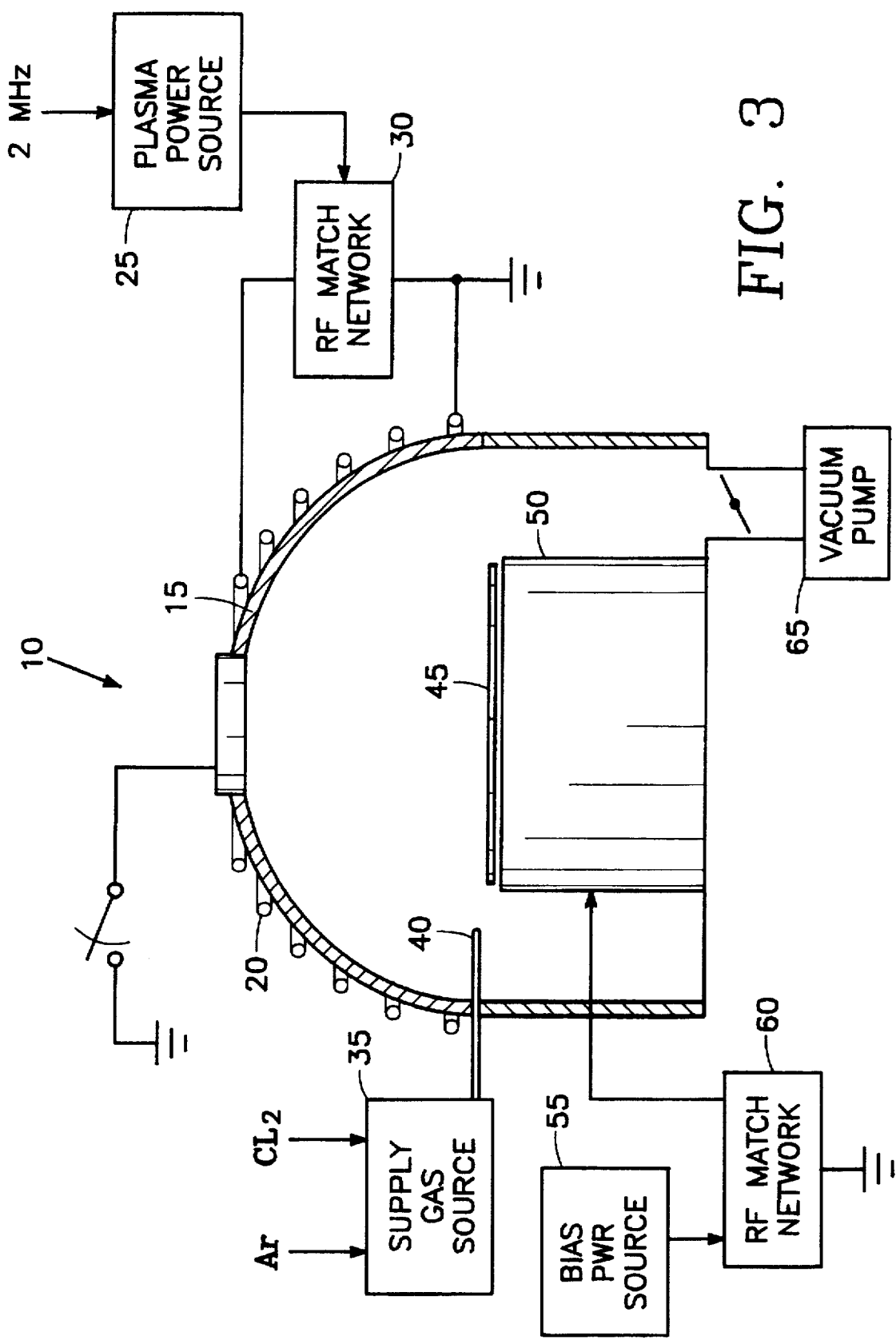
FIG. 3 is a simplified diagram of an inductive high density plasma metal alloy etch reactor employed in carrying out the present invention.

Any suitable inductively coupled high density plasma etch reactor may be employed in carrying out the present invention, provided certain modifications are made as described below herein. For example, referring to FIG. 3, an inductively coupled high density plasma metal alloy etch plasma reactor employed in one application of the invention as but one of many possible examples has a vacuum chamber housing 10 with a dome ceiling 15 (for example) around which is wrapped a dome-shaped RF coil antenna 20 connected to a 2 MHz plasma power source 25 through an RF match network 30 of the type well-known in the art. An etchant gas supply source 35 furnishes an etchant gas such as chlorine or a chlorine-containing gas including an inactive or inert gas such as nitrogen, for example, to the chamber interior through a gas distribution apparatus 40. The workpiece or semiconductor integrated circuit wafer 45 is held on a conductive pedestal 50 supported near the bottom of the chamber housing 10. A 13.56 mHz plasma RF bias power supply 55, which controls the plasma ion energy, is connected to the pedestal 50 through a conventional RF match network 60. A vacuum pump 65 controls the interior pressure inside the reactor chamber housing 10.

Figure 4:
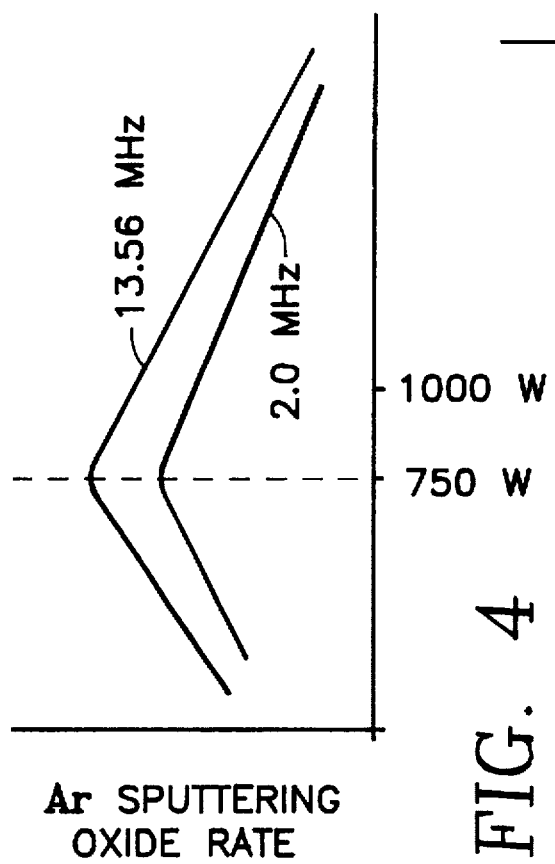
FIG. 4 is a graph illustrating a relationship between the Argon sputtering rate of a silicon oxide film and the plasma source power for a frequency of 13.56 mHz employed in the prior art and for a frequency (2 mHz) in the frequency regime employed in the present invention.

In accordance with the present invention, the plasma power source 25 is a low frequency RF power source, preferably having a frequency of about 2 MHz but in any case not exceeding about 6 MHz. It is a discovery of the present invention that at such a low frequency, if the plasma source power is increased above 750 Watts, the coupling between the plasma power source 25 and the plasma inside the chamber housing 10 becomes primarily inductive, there being only minimal capacitive coupling between the plasma power source 25 and the plasma. Therefore, in accordance with a further aspect of the invention, the plasma power source 25 applies a high RF power level (e.g., greater than about 1,000 Watts) at the low RF frequency to the coil antenna 20. The plasma source power is thus increased by a factor of 1.5 or more without a deleterious increase in the ion bombardment energy because of the lack of capacitive coupling at the low RF frequency. This is illustrated in the graph of FIG. 4, showing how the argon sputtering rate of silicon oxide is significantly lower in the invention in two distinct ways: (a) first, the sputtering rate is lower at 2 MHz than at 13.56 MHz at all levels of plasma source power; (b) secondly, the sputtering rate at 2 mHz decreases as the plasma source power level increases above about 750 Watts.

At such a high power level, the plasma inside the reactor chamber housing 10 is a very high density plasma, improving the etch process. This facilitates a yet further aspect of the invention in which the gas supply source 35 provides a very high concentration of etchant gas (such as chlorine) in the plasma, on the order of about 70 percent and preferably as high as 80 percent or more. In the prior art, such an increase in the chlorine concentration would have been expected to increase the residue remaining after RIE etching. However, in the present invention, such an increase in chlorine concentration virtually eliminates all residues despite the very high etch rate achieved with the high density plasma.

One advantage of this reactor is that the plasma power source 25 and the plasma bias source 55 operate at very different frequencies, thereby avoiding RF interference therebetween and RF match instabilities.

While the foregoing description describes the invention with reference to a single etchant species, such as chlorine, the gas supply source may furnish a mixed gas including more than one etchant species. For example, the mixed gas may consist of chlorine as the primary etchant species with a secondary etchant species such as $BCl_3$ gas or HCl gas or both $BCl_3$ and HCl mixed with the primary etchant species, chlorine. The secondary etchant may also include HBr. In any case, the primary etchant species, whether or not it is mixed with a secondary etchant species in the supply gas, constitutes greater than 50% of the supply gas and preferably as high as 70% or more, as described above.

The etch process achieved in the present invention is very clean, with very little sidewall residue deposition and virtually no etch profile microloading.

Figure 5:
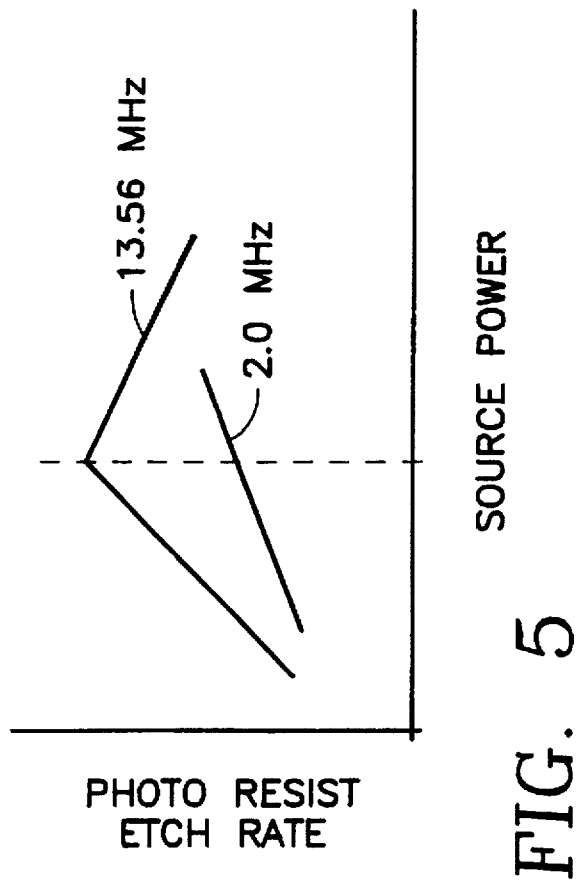
FIG. 5 is a graph illustrating a relationship between photoresist etch rate and plasma source power for a frequency regime of the prior art (13.56 mHz) and for a frequency regime (2.0 mHz) employed in the present invention.

While the prior art would have expected a deleterious increase in photoresist sputter rate with the increase in plasma source power level to over 1,000 Watts, no such resist etch rate increase is observed because of the reduction of capacitive coupling achieved with a low RF frequency plasma power source. This is illustrated in the graph of FIG. 5, showing how the photoresist removal rate with the plasma source power at 2 MHz is less than at 13.56 MHz across a wide range of plasma source power.

With the reduction in capacitive coupling from the plasma source power to the plasma by the reduction in plasma source power frequency, there is no increase in electric potential of the plasma ions near the wafer surface as the plasma source power level is increased. Moreover, as shown in the graphs of FIGS. 4 and 5, a change occurs when the plasma source power reaches 750 Watts, at which point the evidence implies that the primary plasma coupling mode switches from principally capacitive coupling to principally inductive coupling. This transition becomes more complete as the power level approaches 1,000 Watts, so that sputtering, rather than increasing with power, decreases for power levels above 750 Watts. The resulting increase in plasma ion density increases the conductivity therethrough, thereby reducing the plasma or ion potential, and hence the sputtering rate. One benefit of this is that the photoresist sputter rate falls with the increase in power above 750 Watts.

With a higher density plasma, etch residues are readily removed and the residue removal window is wider. Therefore, the chlorine concentration increase is not accompanied by any residue formation.

With the increased chlorine concentration, a far greater metal alloy etch rate is realized, which significantly exceeds the rate at which photoresist residue is deposited on the vertical side walls of etched features in the metal layer. Moreover, the deposition rate of such photoresist residues has already been decreased by virtue of the decrease in sputtering rate, discussed immediately above. As a result, there is virtually no dependence upon the ricocheting of ions among closely spaced vertical walls to remove photoresist residues deposited thereon during etching. Accordingly, etch profile microloading is also eliminated in the invention. The result is that profile of the side walls of etched features in the metal alloy layer is perfectly vertical, or at least nearly so, so that undercutting and poorly profiled side walls are eliminated in the invention.

The invention may be carried out in a chamber volume of, for example, 10,000 to 50,000 cubic centimeters at a pressure, for example, between 0 and 100 milliTorr. In a preferred embodiment, the pressure is less than 20 milliTorr and the chamber volume is about 31,000 cubic centimeters.

While the invention has been described in detail by specific reference to preferred embodiments thereof, it is understood that variations and modifications thereof may be made without departing from the true spirit and scope of the invention.

What is claimed is:

1. An etch process for etching a conductive film on a semiconductor wafer in a plasma reactor having an inductor coil for irradiating said reactor with RF source power and a wafer pedestal for supporting said wafer in said reactor, said etch process comprising the steps of:

applying RF power in excess of 750 Watts at an RF frequency less than 6 MHz to said inductor coil; and introducing a gas into said plasma reactor comprising one or more etchant species for ethching said conductive film constituting greater than 50% and less than 84% of said gas.

2. The etch process of claim 1 further comprising applying a bias RF power at greater than 6 MHz to said wafer pedestal.

3. The etch process of claim 1 wherein said source power is in excess of 1000 Watts.

4. The etch process of claim 3 wherein said RF frequency is about 2.0 MHz.

5. The etch process of claim 4 wherein said etchant species constitutes greater than 70% of said gas.

6. The etch process of claim 5 wherein said etchant species constitutes about 80% of said gas.

7. The etch process of claim 6 wherein said etchant species constitutes greater than 80% of said gas.

8. The etch process of claim 3 wherein said etchant species constitutes greater than 70% of said gas.

9. The etch process of claim 8 wherein said etchant species constitutes about 80% of said gas.

10. The etch process of claim 9 wherein said etchant species constitutes greater than 80% of said gas.

11. The etch process of claim 1 wherein said RF frequency is about 2.0 MHz.

12. The etch process of claim 11 wherein said etchant species constitutes greater than 70% of said gas.

13. The etch process of claim 12 wherein said etchant species constitutes about 80% of said gas.

14. The etch process of claim 13 wherein said etchant species constitutes greater than 80% of said gas.

15. The etch process of claim 1 wherein said etchant species constitutes greater than 70% of said gas.

16. The etch process of claim 15 wherein said etchant species constitutes about 80% of said gas.

17. The etch process of claim 16 wherein said etchant species constitutes greater than 80% of said gas.

18. The etch process of claim 1 wherein said applying and introducing steps are preceded by a step of preliminarily defining features on a top thin film layer of said work piece to be etched.

19. The etch process of claim 18 wherein said defining step comprises depositing photoresist over areas of said top thin film layer which are not to be etched, said photoresist comprising a material which is resistant to attack by said etchant species.

20. The etch process of claim 3, 11, 4, 15, 16, 17, 8, 9, 10, 12, 13, 14, 5, 6, 7, 18 or 19 further comprising applying a bias RF power at greater than 6 mHz to said wafer pedestal.

21. The etch process of claim 1, wherein said RF power is about 1000 Watts or less.

22. The etch process of claim 1, wherein said RF frequency is at least about 2 MHz.

23. The etch process of claim 1, wherein said one or more etchant species constitute no more than about 80% of said gas.

24. An etch process for etching a conductive film on a wafer in a plasma reactor having an inductor coil for irradiating the reactor with RF power, the process comprising the steps of:

introducing into the reactor at least one etchant gas ionizable into a reactant species for etching the conductive film at an etchant gas concentration which is greater than 50% and less than 84% of the total gas composition within the reactor; and coupling RF energy via said coil into the reactor at a power level of at least 750 Watts and at a frequency of less than 6 MHz to maintain a high density plasma within said reactor primarily by inductive coupling.

25. The process of claim 24, wherein the gas within the chamber includes a plurality of etchant gases, and in which a first etchant gas comprises the primary component of said plurality of etchant species.

26. The process of claim 25 wherein said first etchant gas comprises chlorine.

27. The process of claim 24 wherein said reactor comprises a pedestal within said chamber supporting the wafer, said process further comprising the step of applying an RF bias to said pedestal at a frequency of at least 1 MHz.

28. The process of claim 24 further comprising the step of maintaining the chamber at a pressure in the range of 0 to 100 milliTorr.

29. The process of claim 24, wherein said power level is about 1000 Watts or less.

30. The process of claim 24, wherein said frequency is at least about 2 MHz.

31. The process of claim 24, wherein said etchant gas concentration constitutes no more than about 80%.

* * * * *